US006818480B2

(12) United States Patent
Lee et al.

(10) Patent No.: US 6,818,480 B2
(45) Date of Patent: Nov. 16, 2004

(54) METHOD OF FORMING A PATTERN OF A SEMICONDUCTOR DEVICE AND PHOTOMASK THEREFOR

(75) Inventors: Dae-Youp Lee, Gunpo-si (KR); Joon-Hee Lee, Suwon-si (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/348,895

(22) Filed: Jan. 23, 2003

(65) Prior Publication Data

US 2004/0021221 A1 Feb. 5, 2004

(30) Foreign Application Priority Data

Aug. 2, 2002 (KR) .................................... 2002-0045896

(51) Int. Cl.⁷ ......................... H01L 21/82; H01L 21/44
(52) U.S. Cl. ........................ 438/128; 438/129; 438/666
(58) Field of Search .............................. 438/128, 129, 438/118, 280, 618, 619, 622, 638, 666; 257/208, 211, 758, 773, 775, 776

(56) References Cited

U.S. PATENT DOCUMENTS 6,333,213 B2 * 12/2001 Hasebe et al. .............. 438/129

2003/0211399 A1 * 11/2003 Chang .......................... 430/5

FOREIGN PATENT DOCUMENTS

| KR | 1997-3408 | 6/1995 |
| KR | 1999-39999 | 11/1997 |

* cited by examiner

*Primary Examiner*—Hung Vu
(74) *Attorney, Agent, or Firm*—Harness, Dickey & Pierce, P.L.C.

(57) ABSTRACT

A method of forming the patterns of a semiconductor device uses a photomask employed therein is disclosed. In a semiconductor device having a first region where a plurality of first patterns are separated from each other by a first space and a plurality of second patterns having a larger size than that of the first patterns are separated from each other by a second space that is wider than the first space, the first and second regions being formed on the same layer, a fine gap for transmitting light is formed in a central portion of a mask pattern that corresponds to the second pattern on the photomask for patterning the first and second patterns to reduce the proximity effect. Lifting margin and bridge margin with respect to a pattern where the pattern pitch varies are improved through the use of the fine gap.

23 Claims, 9 Drawing Sheets

METHOD OF FORMING A PATTERN OF A SEMICONDUCTOR DEVICE AND PHOTOMASK THEREFOR

CROSS-REFERENCE TO RELATED APPLICATIONS

This non-provisional application claims priority under 35 U.S.C. § 119 to Korean Patent Application No. 2002-45896 filed Aug. 2, 2002, the contents of which are incorporated herein by reference in its entirety.

BACKGROUND OF THE INVENTION

1. Field of the Invention

The present invention relates generally to a method of manufacturing a semiconductor device, and more particularly, to a method of forming a pattern of a semiconductor device capable of reducing a proximity effect, a photomask that has a layout structure capable of reducing the proximity effect, and a method of exposing an object by using the photomask that has a layout structure capable of reducing the proximity effect.

2. Description of the Related Art

It is well-known that various patterns in semiconductor devices are formed by photolithography processes. In a photolithography process, a photoresist layer, whose solubility varies according to radiation (e.g., X-ray or ultraviolet light), is coated on a semiconductor wafer or coated on a layer (e.g., an insulating layer, a conductive layer, etc.) where patterns are to be formed. Next, portions of the photoresist layer are exposed to light, which alters the solubility of the exposed portions of the photoresist layer. The portions of the photoresist layer having a high solubility to a developing solution are then removed to form photoresist patterns. Using the photoresist patterns, exposed portions of the underlying layer to be patterned may be etched or otherwise processed to form various patterns such as wirings or electrodes.

As the integration of semiconductor devices increases, many new techniques are being explored to permit the formation of fine patterns. Examples of these new techniques include a method using an excimer laser where a short wavelength of light is used, an exposure method using a phase shift mask (PSM), and a modified illumination method, such as off-axis illumination.

The phase shift mask is a mask that uses interference or partial interference of light to expose a pattern having a desired size. Since light passing through the phase shifter has the reverse phase with respect to light passing through the other portion of the phase shift mask, the diffraction of light is utilized in reverse to increase a contrast of the pattern image.

Off-axis illumination is a method where vertical components of incident light are blocked by a lens aperture or a pupil and only oblique incident components of light illuminate a photomask. This method enhances resolution and depth of focus (DOF). However, when a first region where patterns are closely spaced (e.g., a dense region) and a second region where the patterns are not closely spaced (e.g., a sparse region) exist in the same layer, the pattern pitch (i.e., a value adding a linewidth of the pattern to a space between the patterns) of the first region becomes different from that of the second region. A proximity effect is caused due to an optical diffraction of the adjacent patterns in a place where the pattern pitch varies, which generates a pattern lifting or a bridge between the adjacent line patterns.

Figure 1:
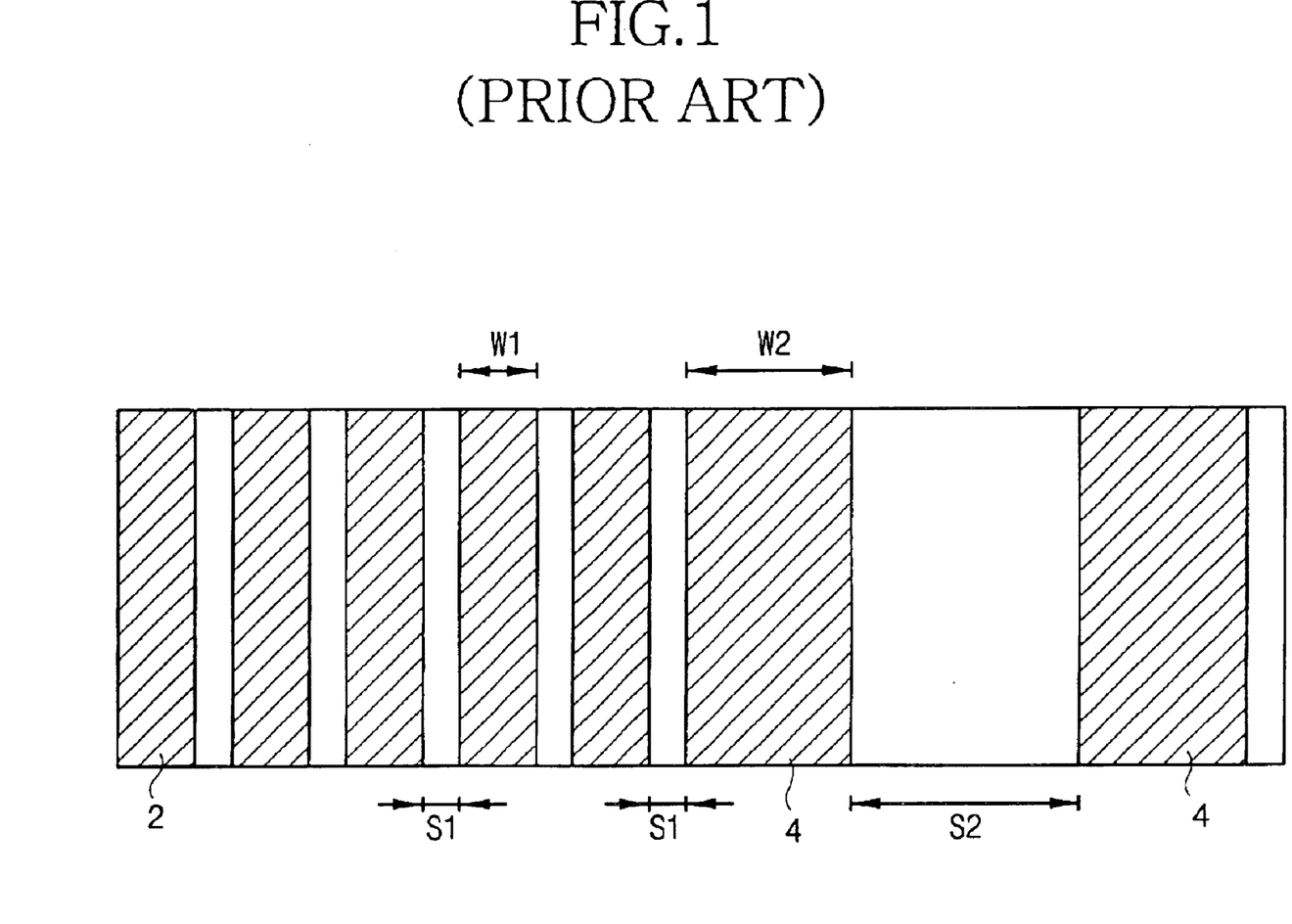
FIG. 1 is a plan view of a prior art photomask utilized for forming patterns on a semiconductor device according to a conventional method.

FIG. 1 is a plan view of a prior art photomask for forming first patterns and second patterns on a semiconductor device. A first region is depicted where the first patterns have a small size and are closely spaced (densely disposed) and a second region where the second patterns have a large size are not closely spaced (sparsely disposed) exist in the same layer on a semiconductor wafer.

Referring to FIG. 1, the conventional photomask includes first mask patterns 2 corresponding to the first patterns and second mask patterns 4 corresponding to the second patterns. The first mask patterns 2 have a first width (w1) and are spaced apart by a first space (s1). The second mask patterns 4 have a second width (w2) that is larger than the first width (w1) and are spaced apart by a second space (s2) that is wider than the first space (s1). The second mask pattern 4 and the first mask pattern 2 are separated by the first space (s1).

Due to the pitch difference of the first and second regions, the second mask pattern 4 adjacent to the first mask pattern 2 is subject to the proximity effect which generates a lifting of the second pattern transferred to the wafer or a bridge between the adjacent first and second patterns. For example, the lower portion of the second pattern is exposed due to the spread of light on the second space (s2) between the adjacent second mask patterns 4. Accordingly, an undercut is generated in the second pattern which causes a lifting of the second pattern.

Furthermore, with respect to the first space (s1) between the first mask pattern 2 and the second mask pattern 4, the exposure amount is decreased by an interference of the second mask pattern 4 having a wide width (w2), thereby enlarging the end linewidth of the first pattern adjacent to the second pattern. As a result, a bridge between the adjacent first and second patterns is generated.

To overcome the aforementioned problems, a method has been suggested which forms a scattering bar around the mask patterns on the photomask to correct the proximity effect. Although this method is effective for isolated patterns, it is not very effective for patterns that have different sizes and pitch variation. Because the scattering bar can only be inserted for the patterns having a wide space of 350 nm or more, the scattering bar is not effective for the patterns having a narrow space less than 350 nm.

SUMMARY OF THE INVENTION

At least one exemplary embodiment of the present invention provides a method of forming patterns of a semiconductor device that are capable of reducing the proximity effect.

At least one exemplary embodiment of the present invention provides a photomask that has a layout structure capable of reducing the proximity effect.

At least one embodiment of the present invention provides a method of exposing an object by using a photomask that has a layout structure capable of reducing the proximity effect.

At least one embodiment of the present invention provides a method of forming patterns of a semiconductor device having a first region where a plurality of first patterns are separated from each other by a first space and a second region including a plurality of second patterns that have a size that is larger than the size of the first patterns. The second patterns are separated from each other by a second space that is wider than the first space. The first and second regions are formed on the same layer. A fine gap that transmits light is formed in a central portion of a mask pattern corresponding to the second pattern on a photomask for patterning the first and second patterns to reduce the proximity effect.

In at least one exemplary embodiment of the present invention, the fine gap is formed to be less than half the size of the first pattern. The first pattern and the second pattern are spaced apart from each other by the first space. The second pattern is formed to be more than about twice the size of the first pattern.

At least one exemplary embodiment of the present invention provides a method of forming patterns of a semiconductor device having first line/space patterns of a first pitch and second line/space patterns of a second pitch that are larger than the first pitch. The first and second linespace patterns are formed from the same layer. A fine gap that transmits light is formed in a central portion of a mask pattern corresponding to the second line/space pattern on a photomask for patterning the first and second line/space patterns to reduce the proximity effect.

At least one other embodiment of the present invention provides a photomask for simultaneously forming a plurality of first patterns and a plurality of second patterns on an object by an optical method. The first patterns are separated from each other by a first space and the second patterns are separated from each other by a second space that is wider than the first space. The photomask includes a plurality of first mask patterns repeatedly disposed by the first space to correspond to the plurality of first patterns, a plurality of second mask patterns repeatedly disposed by the second space to correspond to the plurality of second patterns, and a fine gap that transmits light formed in a central portion of each of the second mask patterns.

Another exemplary embodiment of the present invention provides a method of exposing an object that includes placing a photomask over the object to form a plurality of first patterns separated by a first space and a plurality of second patterns having a size larger than that of the first pattern and being separated by a second space that is wider than the first space; and exposing the object by using the photomask. The photomask includes a plurality of first mask patterns separated from each other by the first space to correspond to the plurality of first patterns, a plurality of second mask patterns separated from each other by the second space to correspond to the plurality of second patterns, and a fine gap that transmits light formed in a central portion of each of the second mask patterns.

In at least one exemplary embodiment of the present invention, when a first region where first patterns having a small size are closely spaced (e.g., densely disposed) and a second region where second patterns having a large size are not closely spaced (e.g., sparsely disposed) exist in the same layer, a fine gap is formed in a central portion of a mask pattern of a photomask corresponding to the second pattern. As a result, the proximity effect is reduced to a pattern where the variation of pattern pitch occurs, thereby improving a lifting margin and a bridge margin to the adjacent patterns having a narrow space.

BRIEF DESCRIPTION OF THE DRAWINGS

Exemplary embodiments of the present invention will become readily apparent by reference to the following detailed description when considered in conjunction with the accompanying drawings wherein.

DETAILED DESCRIPTION OF THE PREFERRED EMBODIMENTS

Hereinafter, exemplary embodiments of the present invention will be described in detail with reference to the attached drawings. However, the exemplary embodiments of the present invention can be modified into various other forms, and the scope of the present invention must not be interpreted as being restricted to the exemplary embodiments. The exemplary embodiments are provided to more completely explain the present invention to those skilled in the art. In drawings, the thicknesses of layers or regions are exaggerated for clarity. Like reference numerals in the drawings denote the same members. Also, when it is written that a layer is formed "on" another layer or a substrate, the layer can be formed directly on the other layer or the substrate, or other layers can intervene therebetween.

Figure 2:
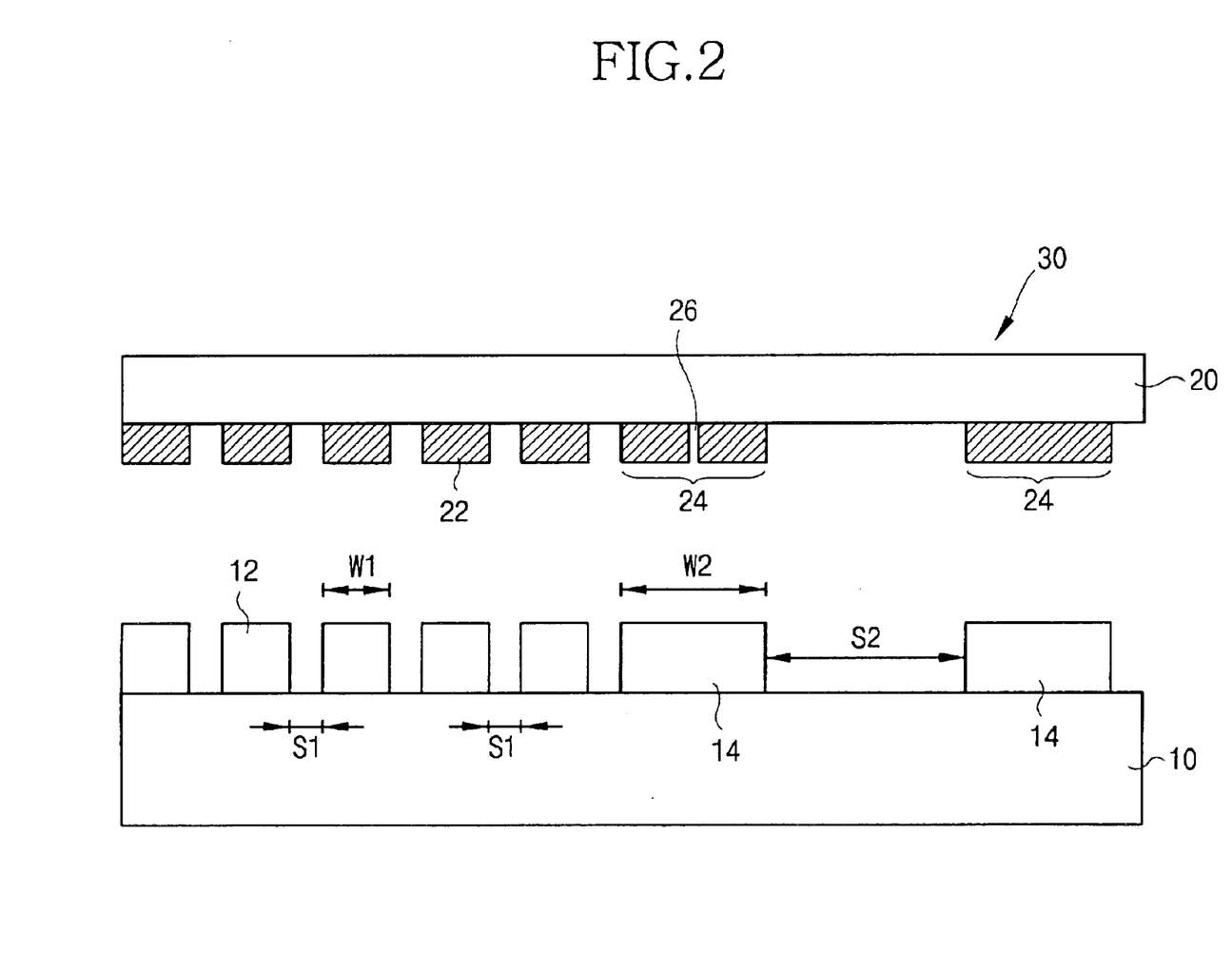
FIG. 2 is a partial cross-sectional view of a semiconductor device illustrating a method of forming patterns on the semiconductor device using a photomask according to one exemplary embodiment of the present invention.
Figure 3:
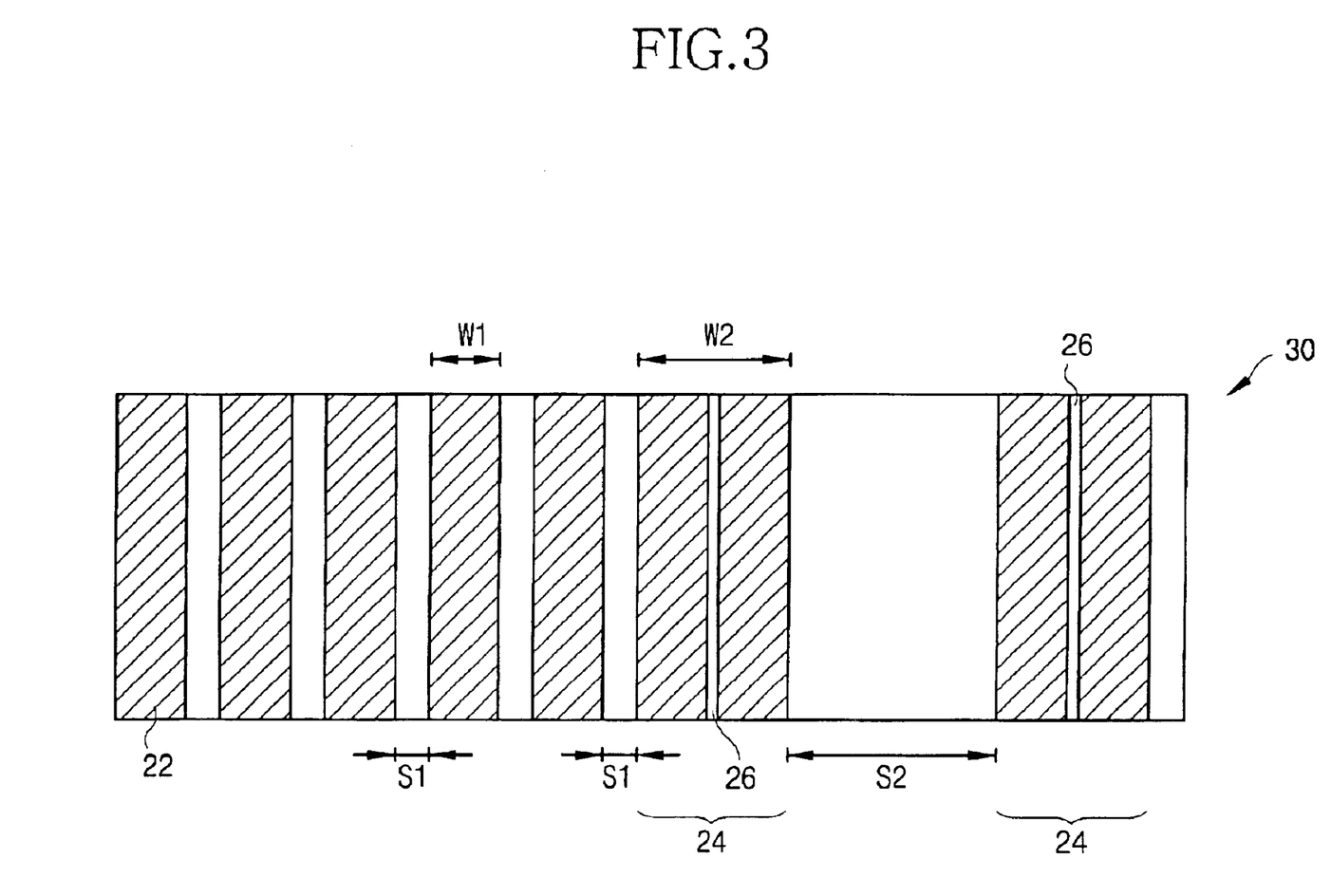
FIG. 3 is a plan view of the photomask shown in FIG. 2.

FIG. 2 is a partial cross-sectional view of a semiconductor device illustrating a method of forming patterns of a semiconductor device according to one exemplary embodiment of the present invention. A first region, where first patterns having a small size are closely spaced (i.e., densely disposed), and a second region, where second patterns having a large size are not closely spaced (i.e., sparsely disposed), exist in the same layer. FIG. 3 is a plan view of the photomask illustrated in FIG. 2.

Referring now to FIGS. 2 and 3, a photoresist film is coated on a layer 10 to be patterned, e.g., a conductive layer is formed on a semiconductor wafer. Next, the photoresist film is exposed using a photomask 30 that includes a plurality of first mask patterns 22 and a plurality of second mask patterns 24 formed on a mask substrate 20, and then developed. As a result, first patterns 12 having a first width (w1) spaced apart from each other by first spaces (s1) and second patterns 14 having a second width (w2) that is larger than the first width (w1) spaced by a second space (s2) that is wider than the first spaces (s1), are formed on the layer 10. The mask substrate 20 may be formed of a transparent material such as glass or quartz and the first and second mask patterns 22 and 24 may be formed of an opaque film such as chromium (Cr).

In the photomask 30, the first mask patterns 22 having a first width (w1) are spaced apart from each other by the first spaces (s1). The second mask patterns 24 having a second width (w2) are spaced apart from the first mask pattern 22 by the first space (s1) and are spaced apart from each other by the second space (s2). A fine gap 26 for transmitting light is formed in a central portion of the second mask pattern 24. Thus, the spread of light caused in the wide second space (s2) between the second mask patterns 24 is suppressed due to light irradiated through the fine gap 26 during exposure, such that the lower portion of the second pattern 14 would not be undercut, which would increase a lifting margin.

Furthermore, since an effect of decreasing the size of the second mask pattern 24 is obtained due to the fine gap 26, the interference phenomenon of the second mask pattern 24 is reduced which increases an exposure amount in the narrow first space (s1) between the first mask pattern 22 and the second mask pattern 24. Accordingly, an increase in the end linewidth of the first pattern 12 due to the proximity effect is reduced, which improves a bridge margin between the first pattern 12 and the second pattern 14.

The fine gap 26 is formed to a size that is not resoluble on the wafer. It is desirable that the fine gap 26 is formed less than half the size of first pattern 12. Preferably, the fine gap 26 is formed to a size of approximately 10–50 nm.

In order to form such a fine gap 26 as described above, the second pattern 14 may be formed more than about twice the size of the first pattern 12. Preferably, the second pattern 14 is about 220 nm in size.

Figure 4A:
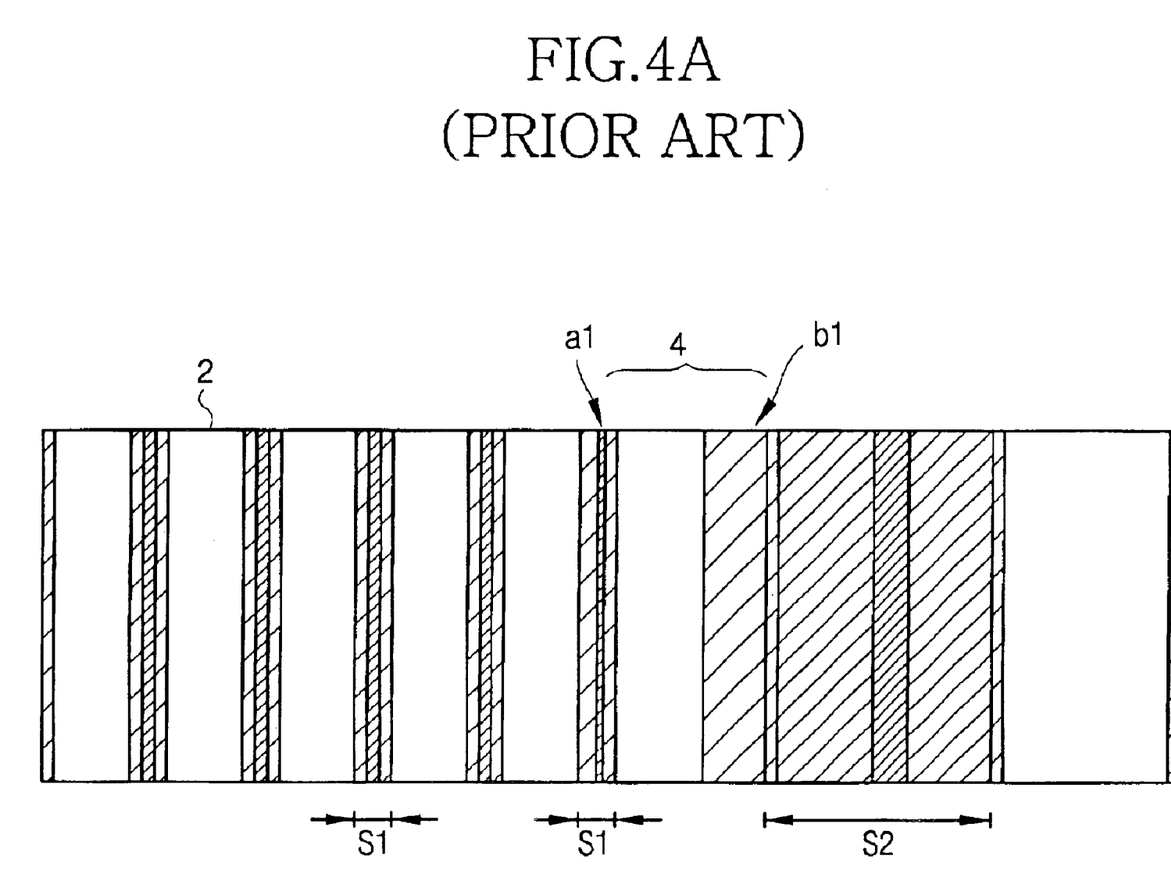
FIGS. 4A and 4B are schematic views showing aerial images of patterns obtained from the conventional photomask and the photomask of an exemplary embodiment of the present invention, respectively.
Figure 4B:
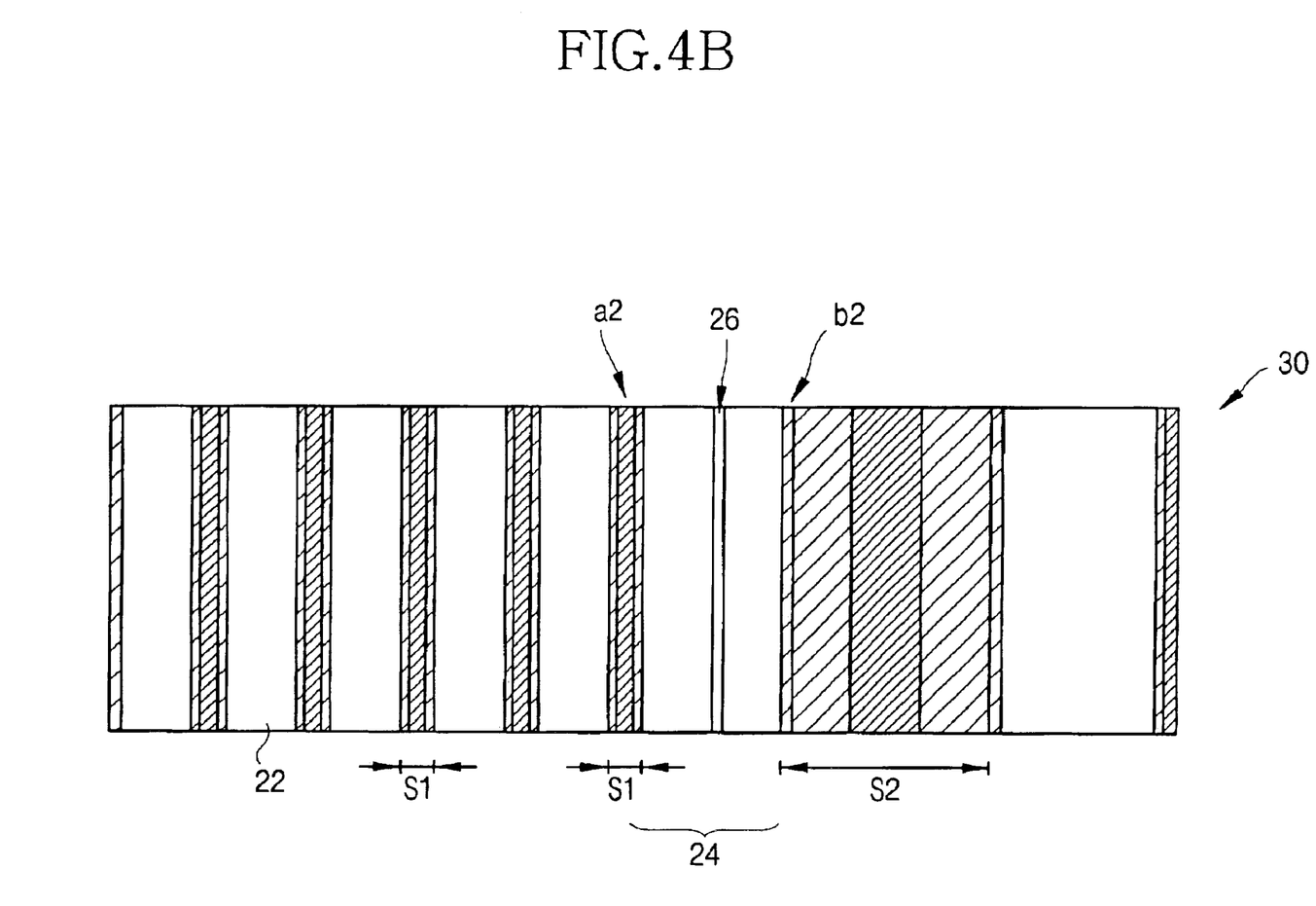

FIGS. 4A and 4B are schematic views showing aerial images of patterns obtained from the conventional photomask and the photomask, respectively, according to one exemplary embodiment of the present invention. In FIGS. 4A and 4B, the oblique lines indicate the intensity of incident light. As the oblique lines become dense, the intensity of light is increased.

In FIG. 4A, which shows an aerial image of the pattern formed by the conventional photomask, the light-intensity difference of the pattern part and the non-pattern part are clearly shown in the dense first region corresponding to the first mask pattern 2 separated by the first spaces (s1). However, in the pattern part corresponding to the second mask pattern 4, where the pattern pitch varies, the light-intensity difference between the pattern part and the non-pattern part becomes obscure due to the proximity effect of the adjacent patterns. Accordingly, in the wide space (s2) between the adjacent second mask patterns 4, incident light is penetrated to the pattern part that corresponds to the second mask pattern 4 by the spread phenomenon of light (b1). As a result, the lower portion of the pattern is undercut in the exposure step, thereby resulting in the lifting of the pattern.

Further, in the narrow space (s1) between the first mask pattern 2 and the second mask pattern 4, the intensity of light is reduced by the interference phenomenon corresponding to the second mask pattern 4 (a1). Thus, the end linewidth of the adjacent pattern is increased, which generates a bridge between the adjacent line patterns.

In FIG. 4B, which shows an aerial image of the pattern formed by the photomask according to one exemplary embodiment of the present invention, the light-intensity difference between the pattern part and the non-pattern part is clearly seen in the first region corresponding to the first mask patterns 22 separated from each other by the first spaces (s1) and in the second region corresponding to the second mask patterns 24 separated from each other by the second spaces (s2). Contrary to the conventional method depicted in FIG. 4A, in the boundary region where the pitch difference is generated between the first region and the second region, the light-intensity difference between the pattern part and the non-pattern part becomes distinct due to the fine gap 26 formed in the central portion of the second mask pattern 24 which has a large size.

In other words, the spread of light caused by the wide second space (s2) between the second mask patterns 24 is suppressed by light irradiated through the fine gap 26. Therefore, incident light cannot penetrate to the pattern part that corresponds to the second mask pattern 24 (b2). Thus, the exposure of the lower portion of the pattern is reduced, which thereby improves the lifting margin.

Furthermore, because the interference phenomenon of the second mask pattern 24 is reduced by the fine gap 26, the exposure amount is increased in the narrow first space (s1) between the first mask pattern 22 and the second mask pattern 24 (a1). Accordingly, the exposure amount of the non-pattern part is increased, which improves the bridge margin to the adjacent patterns.

Figure 5A:
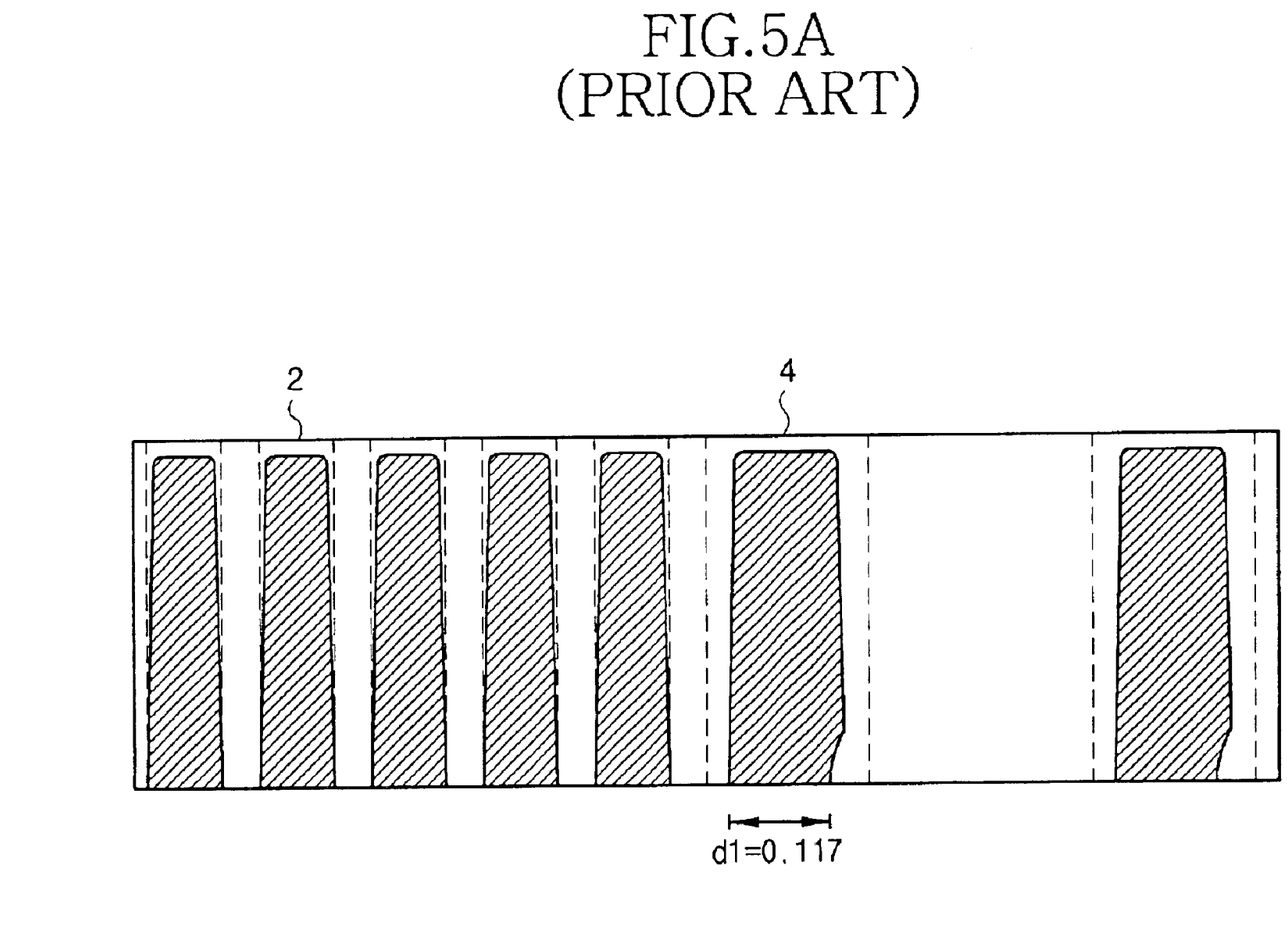
FIGS. 5A and 5B are schematic views showing pattern profiles for 0.0 $\mu$m focus obtained from the conventional photomask and the photomask of an exemplary embodiment of the present invention, respectively.
Figure 5B:
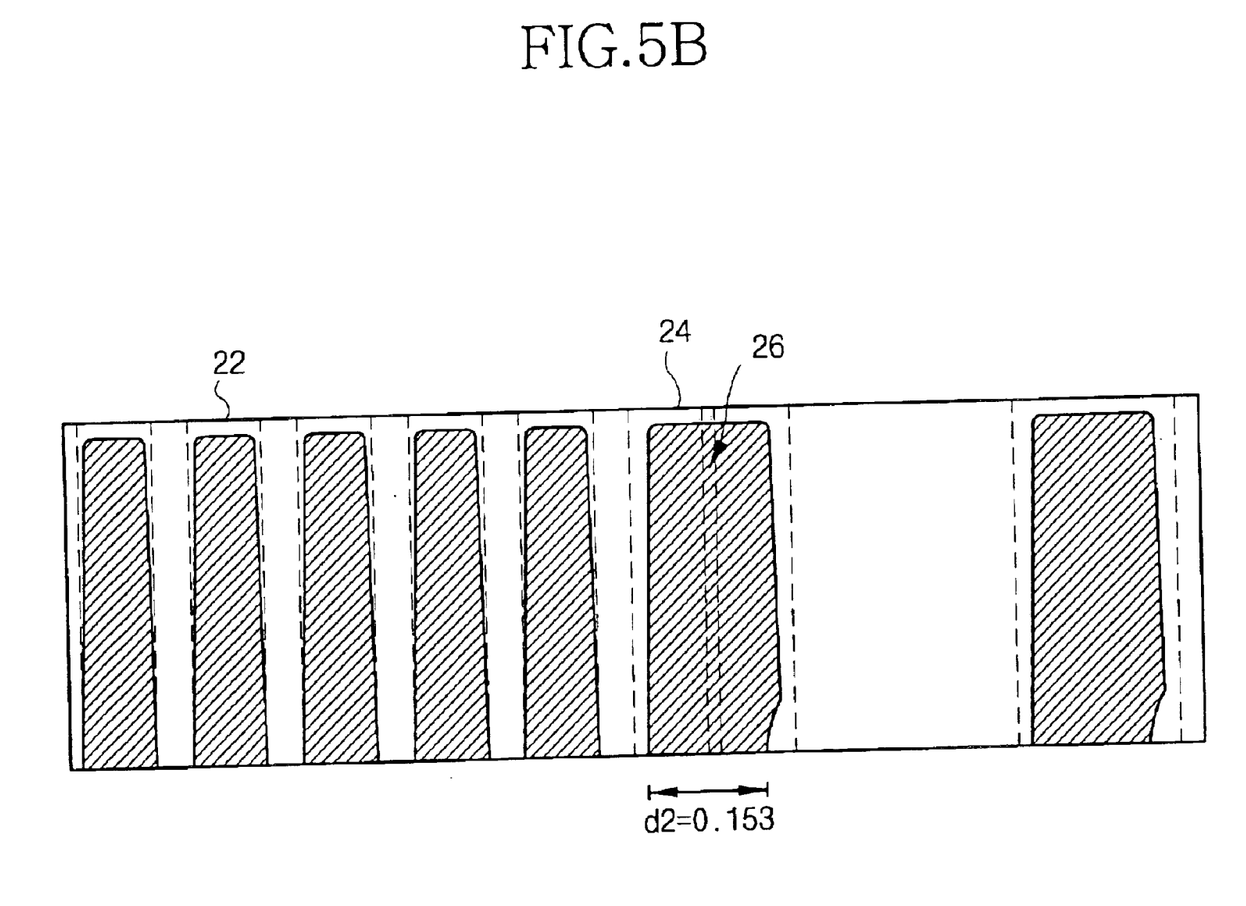

FIGS. 5A and 5B are schematic views showing pattern profiles for 0.0 micron focus obtained from a conventional photomask and the photomask of an exemplary embodiment of the present invention, respectively.

In FIG. 5A, which shows a pattern profile of the conventional photomask, the light-intensity difference between the pattern part and the non-pattern part becomes obscure due to the proximity effect caused by the adjacent patterns in the pattern part that corresponds to the second mask pattern 4 where the pattern pitch varies. Accordingly, in the wide space between the adjacent second mask patterns 4, incident light is penetrated to the pattern part that corresponds to the second mask pattern 4 by the spread phenomenon of light. As a result, the lower width (d1) of the pattern is decreased to about 0.117 due to the pattern undercutting.

In FIG. 5B, which shows a pattern profile obtained by a photomask of an exemplary embodiment of the present invention, the proximity effect of the region where the pattern pitch varies is reduced due to the fine gap 26 formed in the central portion of the second mask pattern 24 that has a relatively large size. The spread of light in the wide space between the second mask patterns 24 is suppressed by the light irradiated through the fine gap 26. As a result, incident light cannot penetrate to the pattern part that corresponds to the second mask pattern 24. Thus, no pattern undercutting is generated, which results in the lower width (d2) of the pattern becoming larger than that of the corresponding conventional pattern, e.g., about 0.153, thereby improving the lifting margin of the pattern.

Figure 6:
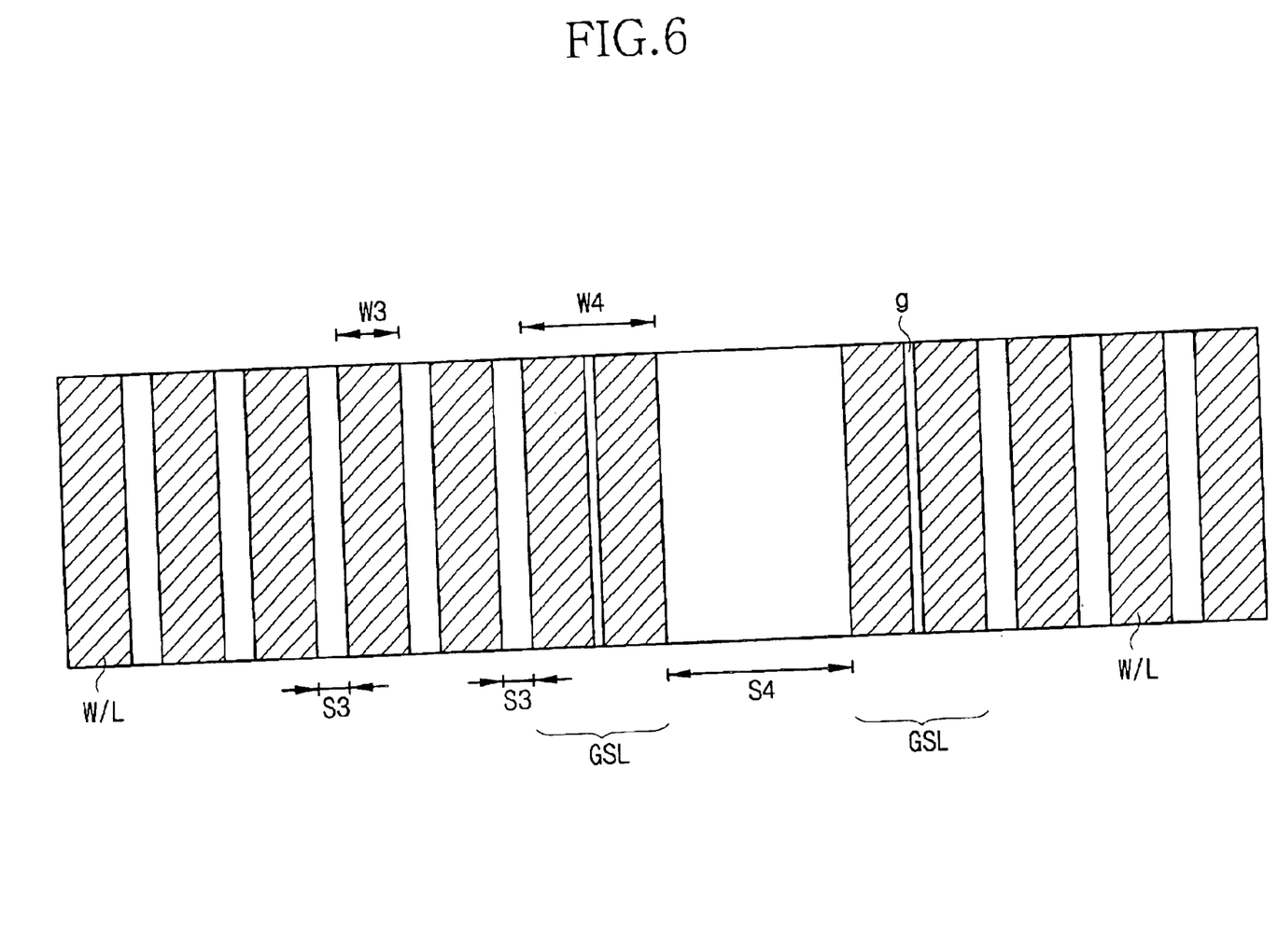
FIG. 6 is a plan view showing a portion of memory cells of NAND-type flash memory device in accordance with an exemplary embodiment of the present invention.

FIG. 6 is a plan view showing a portion of the memory cells of a NAND-type flash memory device in accordance with an exemplary embodiment of the present invention.

Referring to FIG. 6, in the NAND-type flash memory cell, a plurality of cell transistors is connected in series between a bit line contact hole and a common source line (CSL) to constitute one string. A plurality of such strings are connected in parallel to the bit line, which forms one block. Such blocks are symmetrically arranged with respect to the bit line contact hole.

Active regions, in which channels and sources/drains of memory cell transistors are formed, are spaced by field regions and extend in a first direction in a parallel configuration to each other. A plurality of word lines (W/L) are spaced apart from each other and extend in a second direction perpendicular to the first direction on the active regions.

In one string, a string select line (SSL) and a ground select line (GSL), which are select transistors, are provided at outer portions of a first word line and an nth word line, respectively. A drain of the string select transistor (SST) is connected to the bit line extending in the first direction as in the active region. A source of the ground select transistor is connected to the common source line (CSL). The common source line (CSL) is coupled to the source regions of each of the transistors through a common source region.

In the NAND-type flash memory cell having such a structure as defined above, a plurality of word lines (W/L) have a first width (w3) of about 90 nm and are separated from each other by a first space (s3) of about 130 nm or less. The string select line (SSL) and the ground select line (GSL) have a second width (w4) that is larger than the first width (w3), e.g., a width of approximately 240 nm, and are separated from each other by a second space (s4) that is wider than the first space (s3), e.g., a space of approximately 350 nm. The string select line (SSL) and the ground select line (GSL) are spaced apart from the word line (W/L) by the first space (s1), respectively.

Since the small-size word lines (W/L) which are closely spaced (e.g., densely disposed) and the large-size select lines (SSL, GSL) which are not closely spaced, (e.g., relatively sparsely disposed) are formed on the same layer in the NAND-type flash memory cell, when applying the conventional photomask, the proximity effect to the select lines (SSL, GSL), where the pattern pitch varies, is increased. Such an increase in the proximity effect could result in the generation of the lifting of the select lines (SSL, GSL) or in the generation of the bridge between the select lines (SSL, GSL) and the word line (W/L).

The scattering bar for correcting the proximity effect is used only for the pattern space of 350 nm or more. Accordingly, a scattering bar cannot be used in the above-described configuration because the space between the string select line (SSL) and the ground select line (GSL) is not more than 350 nm.

In order to reduce the proximity effect, a fine gap (g) of approximately 10–50 nm is formed in a central portion of a mask pattern on a photomask corresponding to the large-size select lines (SSL, GSL).

In the wide space (s4) between the ground select line (GSL) and the ground select line (GSL) or between the string select line (SSL) and the string select line (SSL), the spread of light is suppressed due to light irradiated through the fine gap (g), thereby reducing the lifting of the select lines (SSL, GSL).

Further, due to light passing through the fine gap (g), an exposure amount is increased in the narrow space between the ground select line (GSL) and the word line (W/L), as well as in the space between the string select line (SSL) and the word line (W/L), which reduces the enlargement of the end linewidth of the word line (W/L) and reduces the generation of bridges between the word line (W/L) and the select lines (GSL, SSL).

Figure 7:
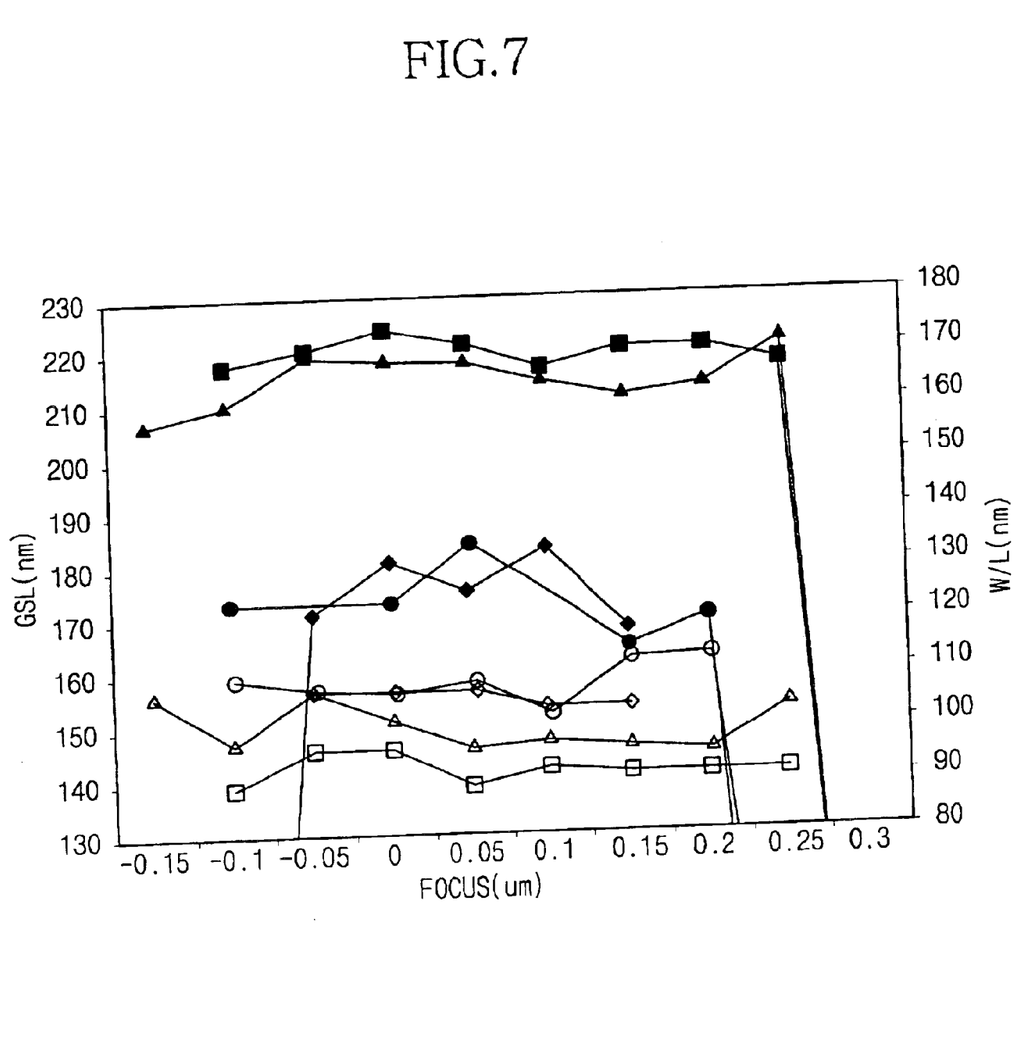
FIG. 7 is a graphical illustration depicting measurement sizes of a ground select line and a word line in the flash memory device depicted in FIG. 6, versus a focus of exposure process for the width of a fine gap in a mask pattern.

FIG. 7 is a graph illustrating the measurement sizes of the ground select line (GSL) and the word line (W/L) in the flash memory device depicted in FIG. 6 versus a focus of exposure process for the width of the fine gap formed in the mask pattern. The symbol ● reflects a size of the ground select line (GSL) by the conventional method, while symbols ◆, ▲, and ■ indicate the GSL sizes when the width of the fine gap is 30 nm, 40 nm and 50 nm, respectively. The symbol ○ reflects a size of the word line by the conventional method, while symbols ◇, △ and □ indicate the W/L sizes when the width of the fine gap is 30 nm, 40 nm and 50 nm, respectively.

Referring now to FIG. 7, in the conventional method (●), the word line (W/L) is measured to have a size of about 105–115 nm larger than the design rule of 90 nm due to the increase in the end linewidth caused by the proximity effect in the region where the pitch variation occurs.

On the other hand, since the proximity effect is reduced by the fine gap according to the principles of exemplary embodiments of the present invention, the increase in the end linewidth of the word line (W/L) adjacent to the ground select line (GSL) having a large size is suppressed due to the improvement of the bridge margin. For the ground select line (GSL), the reduction in the lower width of the pattern is decreased by the improvement of the lifting margin. In particular, when the width of the fine gap is 50 nm (□,■), the word line (W/L) and the ground select line (GSL) are patterned to the same size as that of the design rule of 90 nm and 220 nm, and the pattern size is maintained even though a defocus is generated.

In circumstances in which a first region, where first patterns having a small size are closely spaced (e.g., densely disposed), and a second region, where second patterns having a large size are not closely spaced (e.g., sparsely disposed), exist in the same layer, a fine gap is formed in a central portion of a mask pattern of a photomask that corresponds to the second pattern. As a result, the proximity effect to a pattern where the variation of pattern pitch occurs is reduced, thus improving the lifting margin and improving the bridge margin to the adjacent patterns of narrow space.

Although the exemplary embodiments of the present invention have been described, it is understood that the present invention should not be limited to these exemplary embodiments but various changes and modifications can be made by one skilled in the art within the spirit and scope of the present invention as hereinafter claimed.

What is claimed is:

1. A method of forming patterns or a semiconductor device having a first region where a plurality of first patterns having a first size are spaced apart by a first space and a second region where a plurality of second patterns having a second size larger than the first size of the first patterns are separated by a second space wider than the first space, the first and second regions being formed on a same layer, wherein a gap transmitting light in a central portion of a mask pattern corresponding to the second pattern on a photomask for patterning the first and second patterns is formed to reduce a proximity effect in the central portion of the mask pattern.

2. The method of claim 1, wherein the gap is formed with a size less than half a size of the first pattern.

3. The method of claim 2, wherein the size of the gap is approximately 10–50 nm.

4. The method of claim 1, wherein the first region and the second region are spaced apart from each other by a distance substantially equal to the first apace.

5. The method of claim 1, wherein the second pattern is formed with a size more than twice the size of the first pattern.

6. The method of claim 5, wherein the second pattern is formed to a size of at least 220 nm.

7. A method of forming patterns on a semiconductor device having first line/space patterns of a first pitch and second line/space patterns of a second pitch that are larger than the first pitch, the first, and second line/space patterns being formed on a same layer, wherein a gap transmitting light is formed in a central portion of a mask pattern corresponding to the second line/space pattern on a photomask for patterning the first and second line/space patterns to reduce a proximity effect in the central portion of the mask pattern.

8. The method of claim 7, wherein a width of the gap is formed less than half the pitch of the first line/space pattern.

9. The method of claim 7, wherein the pitch of the second line/space pattern is formed more than twice the pitch of the first line/space pattern.

10. A method of exposing an object for forming a plurality of first patterns separated by a first space and a plurality of second patterns having a larger size than a corresponding size of the first pattern and separated by a second space that is wider than the first space comprising:

locating a photomask over the object, the photomask having a plurality of first mask patterns separated by the first space to correspond to the plurality of first patterns and a plurality of second mask patterns separated by the second space to correspond to the plurality of second patterns and further having a gap formed in a central portion of each of the second mask patterns for transmitting light into the central portion of each of the second mask patterns; and exposing the object by using the photomask.

11. The method of claim 10, wherein the gap is formed with a size less than half the size of first pattern.

12. The method of claim 10, wherein the gap has a size of approximately 10–50 nm.

13. The method of claim 10, wherein the first mask pattern and the second mask pattern are spaced apart from each other by a distance substantially equal to the first space.

14. The method of claim 10, wherein the second mask pattern is formed more than twice the size of the first pattern.

15. The method of claim 10, wherein the second mask pattern has a site of at least 220 nm.

16. A method of forming a pattern on a layer of an inchoate a semiconductor device comprising:

coating a substrate with a layer arranged into at least first and second patterns with at least two different characteristics, each pattern including portions of the layer;

the coating of the substrate including forming a non-resoluble gap into at least one layer-portion in the second pattern; and exposing the layer of the inchoate semiconductor devices.

17. The method of claim 16, wherein said at least two different characteristics are selected from the group consisting of at least two different widths and at least two different pitches.

18. The method of claim 16, wherein the first pattern is spaced apart by a first space and the second pattern is spaced apart by a second space that is larger than the first space.

19. The method of claim 16, wherein said gap occurs in a central portion of the layer portion.

20. A method of making a photomask comprising:

coating a mask substrate with a layer; and patterning the layer to form at least first and second patterns with at least two different characteristics, each pattern including portions of the layer, the patterning of the layer including forming a non-resoluble gap into at least one layer-portion in the second pattern.

21. The method of claim 20, wherein said at least two different characteristics are selected from the group consisting of at least two different widths and at least two different pitches.

22. The method of claim 20, wherein the first pattern is spaced apart by a first space and the second pattern is spaced apart by a second space that is larger than the first space.

23. The method of claim 20, wherein said gap occurs in a central portion of the layer portion.

* * * * *